United States Patent
Tsutsumi et al.

(10) Patent No.: US 8,174,639 B2
(45) Date of Patent: May 8, 2012

(54) ELECTRONIC DEVICE

(75) Inventors: Takashi Tsutsumi, Osaka (JP); Shinji Morita, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 253 days.

(21) Appl. No.: 12/758,926

(22) Filed: Apr. 13, 2010

(65) Prior Publication Data
US 2010/0265429 A1 Oct. 21, 2010

(30) Foreign Application Priority Data
Apr. 20, 2009 (JP) .................... 2009-101715

(51) Int. Cl.
*G02F 1/1333* (2006.01)
*H05K 5/00* (2006.01)
(52) U.S. Cl. ............. 349/58; 349/56; 349/139; 361/752
(58) Field of Classification Search .................. 349/56, 349/58, 158, 160, 139; 439/553, 552, 557, 439/562, 939, 544, 549; 361/752
See application file for complete search history.

(56) References Cited

U.S. PATENT DOCUMENTS

| | | | | |
|---|---|---|---|---|
| 5,134,548 A | * | 7/1992 | Turner | ............................ 362/29 |
| 6,083,041 A | | 7/2000 | Kuo et al. | |
| 6,428,352 B1 | | 8/2002 | Boyden | |
| 6,580,476 B2 | * | 6/2003 | Hasegawa | ....................... 349/58 |
| 6,741,299 B2 | * | 5/2004 | Fukayama et al. | .............. 349/58 |
| 7,206,037 B2 | * | 4/2007 | Nishio et al. | .................... 349/58 |
| 2006/0077627 A1 | | 4/2006 | Zhang et al. | |
| 2006/0152664 A1 | * | 7/2006 | Nishio et al. | .................. 349/150 |
| 2008/0090461 A1 | | 4/2008 | Pepe et al. | |
| 2010/0265429 A1 | * | 10/2010 | Tsutsumi et al. | .............. 349/58 |
| 2011/0067041 A1 | * | 3/2011 | Akutsu et al. | ................. 720/703 |

FOREIGN PATENT DOCUMENTS
JP  2000-223221 A  8/2000

OTHER PUBLICATIONS

EP Search Report of corresponding EP Application No. 10 16 0261-3 dated Nov. 16, 2011.

* cited by examiner

*Primary Examiner* — Brian Healy
(74) *Attorney, Agent, or Firm* — Global IP Counselors

(57) ABSTRACT

An electronic device includes a cabinet, a device main body, a printed wiring board, an electric terminal, and a holder plate. The electric terminal is disposed on a first face of the printed wiring board. The electric terminal includes a terminal body and a connector. The holder plate includes a terminal hole, first and second engagement portions, and a restricting portion. The connector of the electric terminal is disposed through the terminal hole. The first and second engagement portions extend from an inner face of the holder plate. The restricting portion extends from the inner face of the holder plate. The restricting portion faces a top face of the terminal body of the electric terminal in a direction perpendicular to the printed wiring board.

9 Claims, 4 Drawing Sheets

ELECTRONIC DEVICE

CROSS-REFERENCE TO RELATED APPLICATIONS

This application claims priority to Japanese Patent Application No. 2009-101715 filed on Apr. 20, 2009. The entire disclosure of Japanese Patent Application No. 2009-101715 is hereby incorporated herein by reference.

BACKGROUND

1. Field of the Invention

The present invention generally relates to an electronic device. More specifically, the present invention relates to an electronic device having an electric terminal.

2. Background Information

A conventional liquid crystal television set includes a liquid crystal module, a cabinet, and a stand. The liquid crystal module is housed in the cabinet. The cabinet has a front cabinet and a rear cabinet. A synthetic resin holder plate is disposed in an opening formed in a side face of the cabinet. A plurality of terminal holes is formed in the holder plate. Connectors of an S-video terminal and RCA terminals are inserted into the respective terminal holes.

The S-video terminal and the RCA terminals are fixed on a support board that includes a printed wiring board. A plurality of engagement tabs for gripping the end edge of the support board are integrally provided protruding from the rear face of the holder plate. A cylindrical part is integrally provided protruding from one side edge of the upper end face of the S-video terminal. A screw insertion hole for inserting a screw is formed in the holder plate opposite the cylindrical part. A pair of support bases is formed by stamping the chassis of the liquid crystal module. Threaded holes are formed in the tops of the support bases. Screw insertion holes for inserting screws are formed in the support board opposite thee threaded holes.

The assembly procedure will now be described. The end edge of the support board is engaged by being plugged in between the engagement tabs. The support board is placed on the support bases. The connectors of the S-video terminal and the RCA terminals are inserted into the terminal holes of the holder plate. The screws are threaded through the screw insertion holes of the support board and into the threaded holes of the support bases, thereby fixing the support board to the chassis. Then, a screw is threaded through the screw insertion hole of the holder plate and into the cylindrical part of the S-video terminal, which fixes the S-video terminal to the holder plate.

When a cord is connected to the S-video terminal, a plug at the distal end of the cord is grasped and pushed against and fitted together with the connector of the S-video terminal. Plugs with cords are also connected to the connectors of the RCA terminals by the same procedure. Another connecter attachment structure is also well known (see Japanese Laid-Open Patent Application Publication No. 2000-223221, for example).

The protrusion length of the connector of the S-video terminal is short. Thus, the connector is disposed in a state of being recessed in the terminal hole. Therefore, the plug is difficult to connect to the connector. The plug has to be connected by being pushed forcefully into the connector. This pushing force lifts up the S-video terminal away from the support board. Thus, there is the risk that the solder connecting the S-video terminal to the support board loosen and rattle, or that the soldering is damaged.

The S-video terminal is fastened with the screw to the holder plate, which reinforces so that the S-video terminal does not move away from the support board. However, because this entails the use of the screw, more parts are required. As a result, the cost is higher, and installing the screw requires more work.

SUMMARY

The present invention was conceived in light of the above-mentioned problems. One object of the present invention is to provide an electronic device in which an electric terminal is secured with a simple and inexpensive structure.

In accordance with one aspect of the present invention, an electronic device includes a cabinet, a device main body, a printed wiring board, an electric terminal, and a holder plate. The device main body is disposed within the cabinet. The printed wiring board is electrically coupled to the device main body. The electric terminal is disposed on a first face of the printed wiring board. The electric terminal is electrically coupled to the printed wiring board. The electric terminal includes a terminal body and a connector. The holder plate is attached to the cabinet. The holder plate includes a terminal hole, first and second engagement portions, and a restricting portion. The connector of the electric terminal is disposed through the terminal hole. The first and second engagement portions extend from an inner face of the holder plate. The first engagement portion contacts with the first face of the printed wiring board. The second engagement portion contacts with a second face of the printed wiring board that is opposite the first face of the printed wiring board. The restricting portion extends from the inner face of the holder plate. The restricting portion faces a top face of the terminal body of the electric terminal in a direction perpendicular to the printed wiring board.

With this electronic device, it is possible to provide an electronic device in which an electric terminal is secured with a simple and inexpensive structure.

BRIEF DESCRIPTION OF THE DRAWINGS

Referring now to the attached drawings which form a part of this original disclosure.

DETAILED DESCRIPTION OF EMBODIMENTS

A preferred embodiment will now be explained with reference to the drawings. It will be apparent to those skilled in the art from this disclosure that the following descriptions of the preferred embodiment are provided for illustration only and not for the purpose of limiting the invention as defined by the appended claims and their equivalents.

Figure 1:
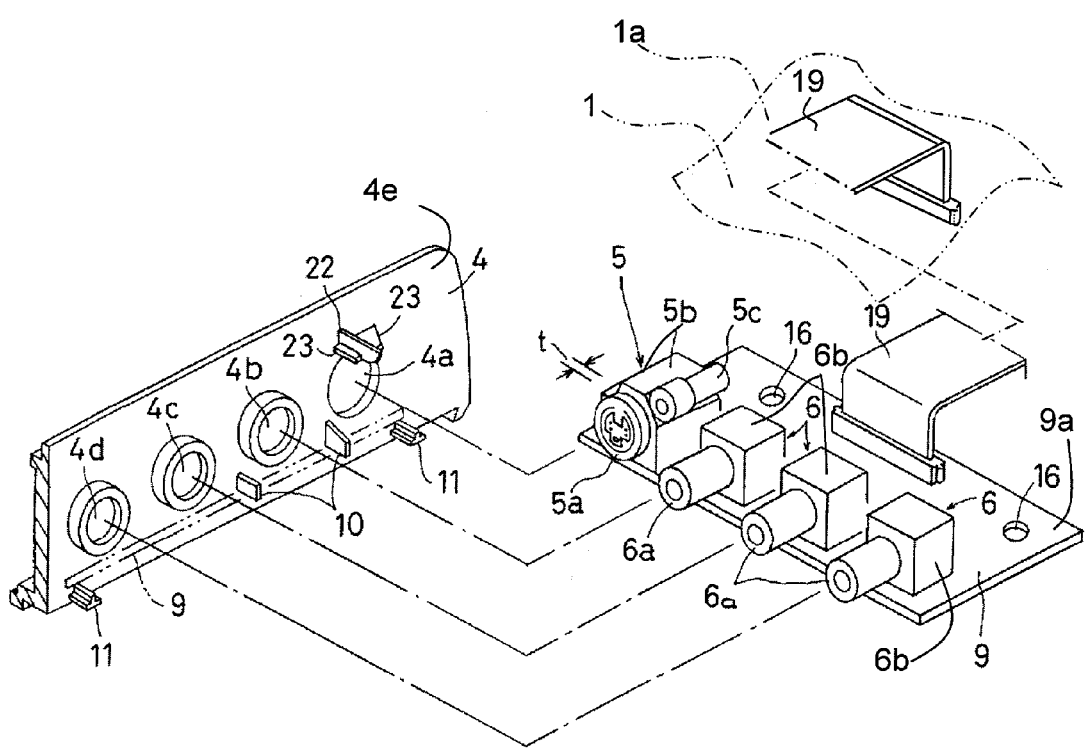
FIG. 1 is an exploded perspective view of a terminal attachment structure of an electronic device in accordance with one embodiment.
Figure 5:
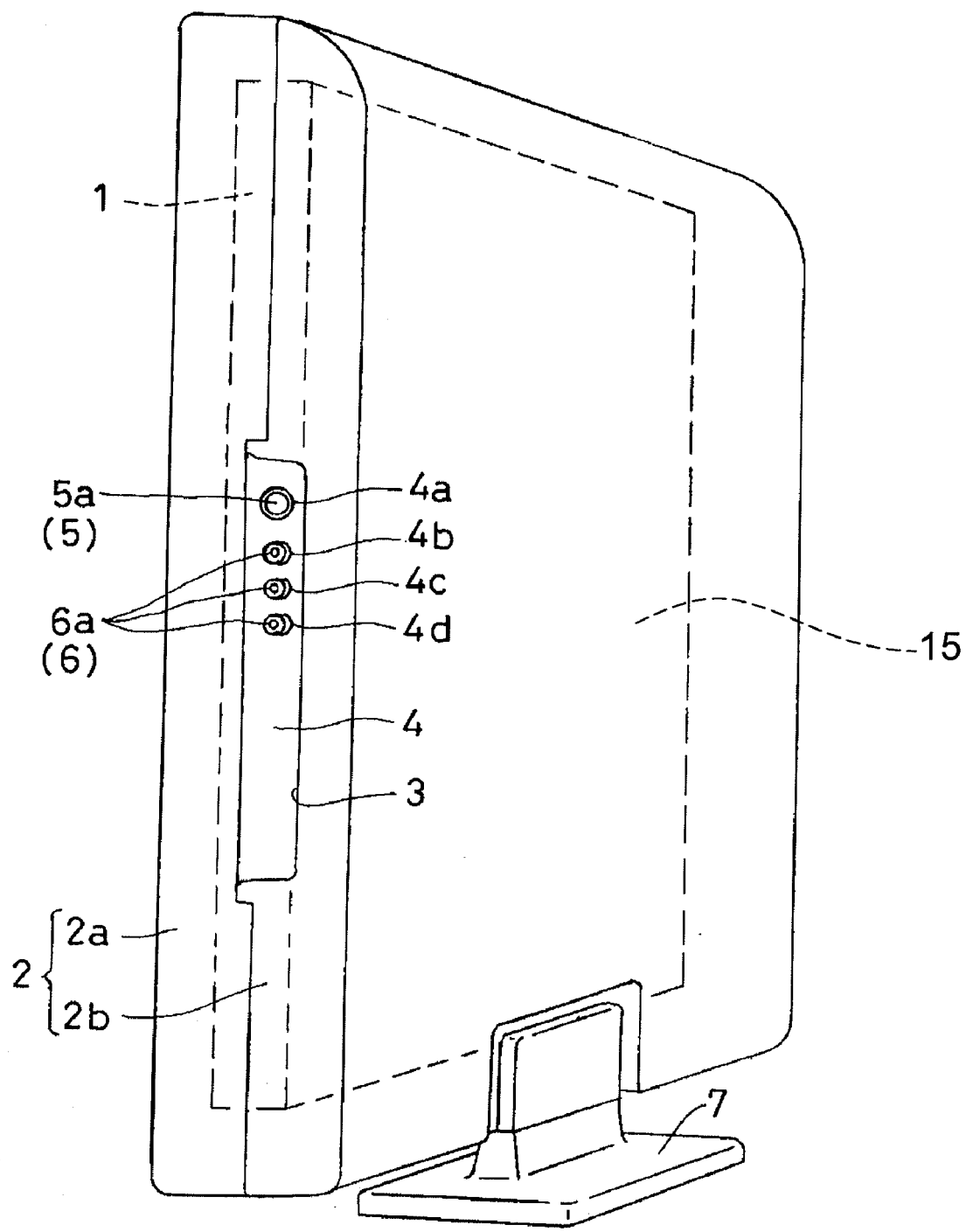
FIG. 5 is a perspective view of the electronic device.

FIG. 5 is a perspective view of an electronic device. The electronic device includes a liquid crystal television set. The electronic device includes a liquid crystal module (e.g., device main body) 1, a cabinet 2, a holder plate 4, an S-video terminal (e.g., electric terminal) 5, a plurality (e.g., three) of RCA terminals 6, and a stand 7. The liquid crystal module 1 is disposed within the cabinet 2. The liquid crystal module 1 mainly includes a liquid crystal panel (e.g., liquid crystal cell) to display image. The liquid crystal module also includes a chasse 15 that houses the liquid crystal panel. The cabinet 2 includes a front cabinet 2a and a rear cabinet 2b. The holder plate 4 is made of synthetic resin. The holder plate 4 is disposed in an opening (e.g., opening portion) 3 formed at a suitable location in a side face of the cabinet 2. A plurality (e.g., four) of terminal holes 4a to 4d is formed in the holder plate 4. In particular, the terminal holes 4a to 4d have an S-video terminal hole (e.g., S-video terminal-use terminal hole) 4a, and RCA terminal holes (RCA terminal-use terminal holes) 4b to 4d. As shown in FIG. 1, the S-video terminal 5 includes a connector (e.g., socket) 5a and a terminal body 5b with an upper end face 5c. The RCA terminals 6 include connectors (e.g., sockets) 6a and terminal bodies 6b. The connectors 5a and 6a of the S-video terminal 5 and the RCA terminals 6 are inserted into the respective terminal holes 4a to 4d. The stand 7 is fixedly coupled to the cabinet 2.

Figure 2:
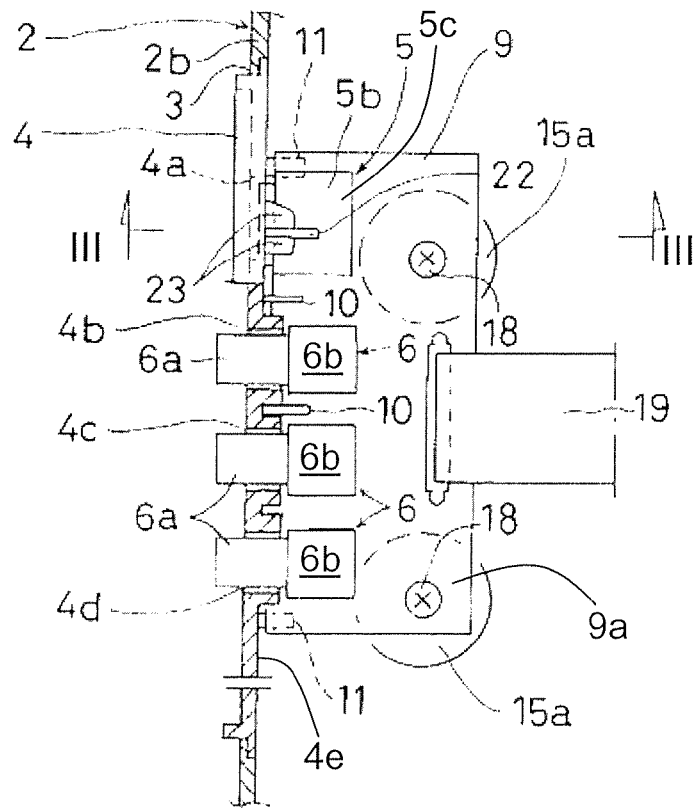
FIG. 2 is a normal view of the terminal attachment structure illustrated in FIG. 1.
Figure 3:
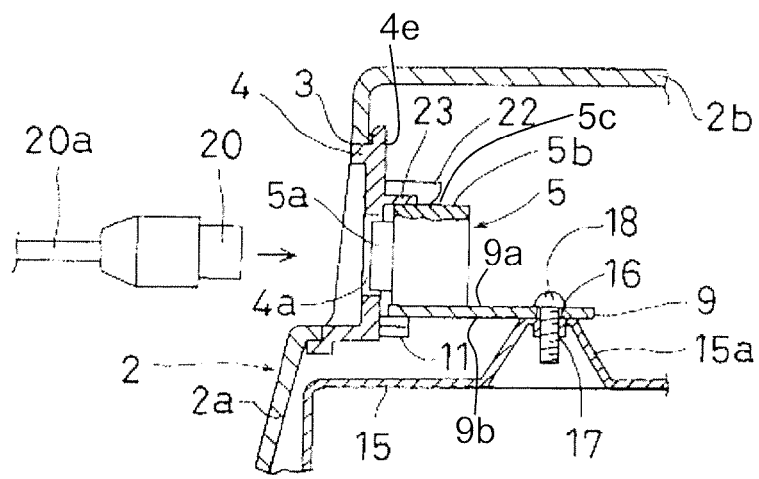
FIG. 3 is a cross sectional view of the terminal attachment structure taken along III-III line in FIG. 2.
Figure 4A:
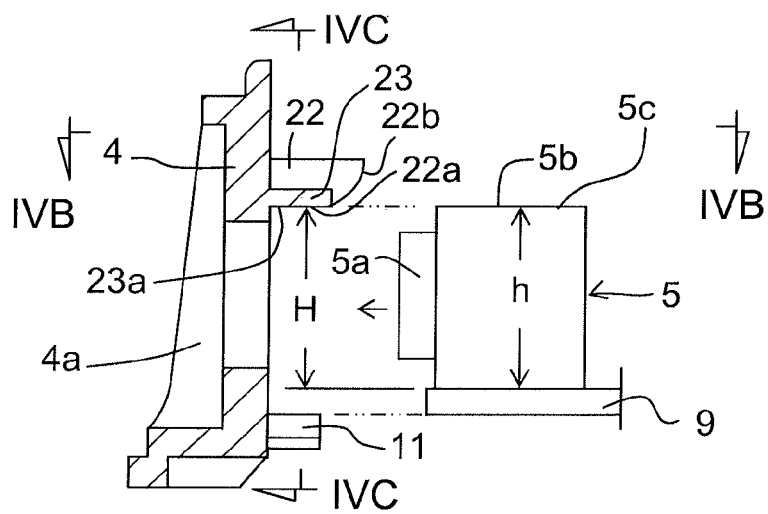
FIG. 4A is an exploded enlarged cross sectional view of the terminal attachment structure.
Figure 4B:
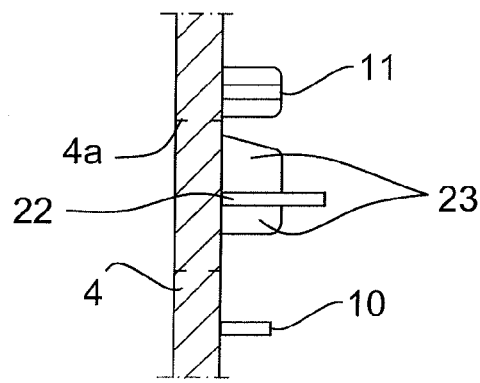
FIG. 4B is a cross sectional view taken along IVB-IVB line in FIG. 4A.
Figure 4C:
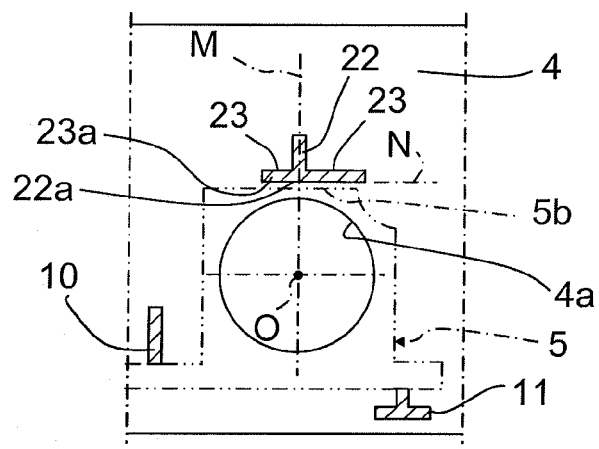
FIG. 4C is a cross sectional view taken along IVC-IVC line in FIG. 4A.

FIGS. 1 to 3, and 4A to 4C show a terminal attachment structure of the electronic device. The terminal attachment structure of the electronic device includes the holder plate 4, the S-video terminal 5, and a support board (e.g., printed wiring board) 9. As shown in FIGS. 1 to 4, the S-video terminal 5 and the RCA terminals 6 are fixed on an upper face 9a of the support board 9. The support board 9 includes a printed wiring board that is electrically coupled to the S-video terminal 5 and the RCA terminals 6. The support board 9 is also electrically connected with a control board 1 a of the liquid crystal module 1 via a flexible flat cable 19. The holder plate 4 has a plurality of engagement tabs (e.g., first and second engagement portions) 10 and 11 for gripping end edge portion of the support board 9. The engagement tabs 10 and 11 are integrally provided protruding from a rear face (e.g., inner face) 4e of the holder plate 4. The engagement tabs 10 contact with the upper face 9a of the support board 9. The engagement tabs 11 contact with a lower face 9b of the support board 9 that is opposite to the upper face 9a. As shown in FIGS. 2 and 3, the chassis 15 of the liquid crystal module 1 has a pair of support bases 15a. The support bases 15a are formed by stamping the chassis 15 of the liquid crystal module 1. Threaded holes 17 are formed in top portions of the support bases 15a, respectively. Screw insertion holes 16 for inserting screws 18 are formed in the support board 9 opposite the threaded holes 17.

As shown in FIGS. 1 to 3, and 4A to 4C, the holder plate 4 further has a contact rib (e.g., restricting portion) 22, and a guide plate (e.g., guide portion) 23. The contact rib 22 is opposite the upper face 9a of the support board 9, with the S-video terminal hole 4a in between, at a spacing H that is the same as or slightly greater than the height h of the S-video terminal 5. In particular, the contact rib 22 is positioned at a location spaced apart from the upper face 9a by a distance that is equal to or greater than the height h of the terminal body 5b of the S-video terminal 5 measured in the direction perpendicular to the upper face 9a. Furthermore, the S-video terminal hole 4a is positioned between the contact rib 22 and the upper face 9a of the support board 9 in the direction perpendicular to the upper face 9a. The contact rib 22 is integrally provided protruding from the rear face 4e of the holder plate 4. The contact rib 22 faces the upper end face 5c of the terminal body 5b of the S-video terminal 5. The contact rib 22 contacts with the upper end face 5c. However, the contact rib 22 can be disposed at spaced apart location from the upper end face 5c with a small gap therebetween.

The contact rib 22 is in the form of a slender plate. The contact rib 22 is disposed along an imaginary line M that passes through the center O of the S-video terminal hole 4a and traverses the holder plate 4 in the direction perpendicular to the upper face 9a of the support board 9. An S-video terminal-opposing face (e.g., bottom face) 22a of the contact rib 22 extends perpendicular to the rear face 4e of the holder plate 4. An arc face 22b is formed spreading outward toward the distal end of the contact rib 22 from the S-video terminal-opposing face 22a. The S-video terminal 5 is guided along the arc face 22b.

The guide plate 23 extends along an imaginary line N that is perpendicular to the imaginary line M and is parallel to the upper end face 5c of the S-video terminal 5 and is in-plane with the S-video terminal-opposing face 22a of the contact rib 22. In particular, the guide plate 23 includes an S-video terminal-opposing face 23a. The S-video terminal-opposing faces 22a and 23a of the contact rib 22 and the guide plate 23 lie in a single plane. The guide plate 23 is integrally provided protruding from the rear face 4e of the holder plate 4 and the contact rib 22. The holder plate 4 is integrally formed with a one-piece, unitary member.

The assembly procedure will now be described. The support board 9 is moved from the state indicated by the solid lines in FIG. 1 into the proximity of the holder plate 4. The upper end face 5c of the S-video terminal 5 is slid from the arc face 22b of the contact rib 22 along the guide plate 23 such that the upper end face 5c of the S-video terminal 5 is brought into contact or proximity with the contact rib 22. As a result, the connectors 5a and 6a of the S-video terminal 5 and the RCA terminals 6 are inserted into the terminal holes 4a to 4d, respectively, and the end edge portion of the support board 9 is plugged in and engaged between the engagement tabs 10 and 11 (see the imaginary lines in FIG. 1). The support board 9 is placed on the support bases 15a, and as shown in FIGS. 2 and 3, the screws 18 are threaded into the threaded holes 17 of the support bases 15a through the screw insertion holes 16, thereby fixing the support board 9 to the chassis 15.

As shown in FIG. 3, when a cord 20a is connected to the S-video terminal 5, a plug 20 at the distal end of the cord 20a is grasped and pushed against and fitted together with the connector 5a of the S-video terminal 5. The cord 20a is electrically connected to another electric device, such as a disk recorder or player. Plugs with cords (not shown) are connected to the connectors 6a of the RCA terminals 6 by the same procedure.

With the terminal attachment structure of the electronic device, the protrusion length t of the connector 5a of the S-video terminal 5 relative to a front face of the terminal body 5b is short, and the connector 5a is disposed in a state of being recessed in the S-video terminal hole 4a. Thus, the plug 20 is connected by being pushed forcefully into the connector 5a of the S-video terminal 5. However, the contact rib 22 prevents this pushing force from lifting the S-video terminal 5 away from the support board 9. Thus, the state of the S-video terminal 5 being fixed to the support board 9 can be reliably maintained without the solder connecting the S-video terminal to the support board 9 loosening and rattling, or the soldering being damaged.

Since the contact rib 22 is integrally provided protruding from the holder plate 4, there is no increase in the number of parts, and the cost can be reduced compared to when the S-video terminal 5 is fastened to the holder plate 4 with a screw. Also, since there is no screw insertion hole in the holder plate 4 for fastening the S-video terminal 5 to the holder plate 4, the appearance of the holder plate 4 can be improved.

Furthermore, the S-video terminal 5 can be fixed at the specified location merely by engaging the end edge portion of the support board 9 with the engagement tabs 10 and 11 and fastening the support board 9 to the chassis 15 inside the cabinet 2. Thus, the assembly work can be carried out more quickly and easily than when the S-video terminal 5 is fastened to the holder plate 4 with a screw. Therefore, the S-video terminal 5 can be attached and fixed easily with a simple and inexpensive structure. Moreover, the electronic device includes the liquid crystal television set. Thus, there is provided a liquid crystal television set that is convenient to use and allows the attachment and fixing of the S-video terminal 5 to be carried out easily with a simple and inexpensive structure.

Also, the connector 5a of the S-video terminal 5 can be reliably and easily inserted into the terminal hole 4a by sliding the S-video terminal 5 along the guide plate 23.

A liquid crystal television set was given as an example in the above embodiment. However, the application of the terminal attachment structure is not limited to this. It can also be applied to any of various electronic devices equipped with an S-video terminal, such as a disk device (such as a Blu-ray Disc recorder or player). Furthermore, the contact rib 22 and the guide plate 23 can be formed for other type of electric terminals, such as the RCA terminals 6 and the like.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of an electronic device with the present invention. Accordingly, these terms, as utilized to describe the present invention should be interpreted relative to an electronic device equipped with the present invention as used in the normal operating position.

While only a preferred embodiment has been chosen to illustrate the present invention, it will be apparent to those skilled in the art from these disclosures that various changes and modifications can be made herein without departing from the scope of the invention as defined in the appended claims. The functions of one element can be performed by two, and vice versa. Every feature which is unique from the prior art, alone or in combination with other features, also should be considered a separate description of further inventions by the applicant, including the structural and/or functional concepts embodied by such feature. Furthermore, the foregoing descriptions of the preferred embodiment according to the present invention are provided for illustration only, and not for the purpose of limiting the invention as defined by the appended claims and their equivalents.

What is claimed is:

1. An electronic device comprising:
   a cabinet;
   a device main body disposed within the cabinet;
   a printed wiring board electrically coupled to the device main body;
   an electric terminal disposed on a first face of the printed wiring board, the electric terminal being electrically coupled to the printed wiring board, the electric terminal including a terminal body and a connector; and
   a holder plate attached to the cabinet, the holder plate including
      a terminal hole through which the connector of the electric terminal is disposed,
      first and second engagement portions extending from an inner face of the holder plate, the first engagement portion contacting with the first face of the printed wiring board, the second engagement portion contacting with a second face of the printed wiring board that is opposite to the first face of the printed wiring board, and
      a restricting portion extending from the inner face of the holder plate, the restricting portion facing a top face of the terminal body of the electric terminal in a direction perpendicular to the printed wiring board.

2. The electronic device according to claim 1, wherein the restricting portion of the holder plate is positioned at a location spaced apart from the first face of the printed wiring board by a distance that is equal to or greater than a height of the terminal body of the electric terminal as measured in the direction perpendicular to the printed wiring board.

3. The electronic device according to claim 2, wherein the restricting portion of the holder plate contacts with the top face of the terminal body of the electric terminal.

4. The electronic device according to claim 3, wherein the terminal hole of the holder plate is positioned between the restricting portion of the holder plate and the printed wiring board in the direction perpendicular to the printed wiring board.

5. The electronic device according to claim 4, wherein the holder plate is disposed within an opening portion of a side face of the cabinet.

6. The electronic device according to claim 5, wherein the printed wiring board is fastened to a chassis of the device main body with a screw.

7. The electronic device according to claim 6, wherein the holder plate further includes a guide portion that extends from the restricting portion parallel to the top face of the electric terminal, the restricting portion and the guide portion having bottom faces that lie in a single plane.

8. The electronic device according to claim 7, wherein the holder plate is integrally formed as a one-piece, unitary member.

9. The electronic device according to claim 8, wherein the device main body includes a liquid crystal module.

* * * * *